(12) United States Patent
Kraus et al.

(10) Patent No.: US 7,659,187 B2
(45) Date of Patent: Feb. 9, 2010

(54) METHOD OF FORMING PN JUNCTIONS INCLUDING A POST-ION IMPLANT DYNAMIC SURFACE ANNEAL PROCESS WITH MINIMUM INTERFACE TRAP DENSITY AT THE GATE INSULATOR-SILICON INTERFACE

(75) Inventors: Philip Allan Kraus, San Jose, CA (US); Vijay Parihar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/735,947

(22) Filed: Apr. 16, 2007

(65) Prior Publication Data

US 2008/0108209 A1    May 8, 2008

Related U.S. Application Data

(60) Provisional application No. 60/856,622, filed on Nov. 3, 2006.

(51) Int. Cl.
    *H01L 21/425* (2006.01)

(52) U.S. Cl. .................. 438/517; 438/166; 438/308; 438/540; 438/795; 257/E21.336; 257/E21.347; 257/E21.474; 257/E21.475; 257/E21.619

(58) Field of Classification Search .......... 438/166, 438/308, 517, 537, 540, 795; 257/E21.336, 257/E21.347, E21.474, E21.475, E21.619
    See application file for complete search history.

(56) References Cited

U.S. PATENT DOCUMENTS 3,778,791 A  12/1973  Lewicki et al. .......... 179/100.2

(Continued)

FOREIGN PATENT DOCUMENTS

DE    10339237 A1    3/2004

(Continued)

OTHER PUBLICATIONS

Anonymous, "Evaluation of the Surface State Using Charge Pumping Methods", Nov. 15, 2000, pp. 1-8, Agilent Technologies. (www.agilent.com).

(Continued)

*Primary Examiner*—Charles D Garber
*Assistant Examiner*—Stanetta D Isaac
(74) *Attorney, Agent, or Firm*—Law Office of Robert M. Wallace

(57) ABSTRACT

A method of forming transistors on a wafer includes forming gates over gate insulators on a surface of the wafer and ion implanting dopant impurity atoms into the wafer to form source and drain regions aligned on opposite sides of each gate. The wafer is then annealed by pre-heating the bulk of the wafer to an elevated temperature over 350 degrees C. but below a temperature at which the dopant atoms tend to cluster. Meanwhile, an intense line beam is produced having a narrow dimension along a fast axis from an array of coherent CW lasers of a selected wavelength. This line beam is scanned across the surface of the heated wafer along the direction of the fast axis, so as to heat, up to a peak surface temperature near a melting temperature of the wafer, a moving localized region on the surface of the wafer having (a) a width corresponding to the narrow beam width and (b) an extremely shallow below-surface depth. During the scanning step, the surface state density at the interface between the semiconductor material and the gate insulator is minimized by continuing to maintain the temperature of the bulk of the wafer outside of the moving localized region at said elevated temperature, while maintaining the rate at which the line beam is scanned along the fast axis at a rate in excess of 300 mm/sec.

19 Claims, 4 Drawing Sheets

U.S. PATENT DOCUMENTS

| | | | | |
|---|---|---|---|---|
| 4,099,875 | A | 7/1978 | McMahon et al. | 356/342 |
| 4,305,640 | A | 12/1981 | Cullis et al. | 350/96.1 |
| 4,448,547 | A | 5/1984 | Wickersheim | 374/131 |
| 4,647,774 | A | 3/1987 | Brisk et al. | 250/338 |
| 4,730,113 | A | 3/1988 | Edwards | 250/347 |
| 5,238,858 | A * | 8/1993 | Matsushita | 438/529 |
| 5,463,202 | A | 10/1995 | Kurosawa et al. | 219/121.83 |
| 5,861,992 | A | 1/1999 | Gelbart | 359/619 |
| 6,080,236 | A | 6/2000 | McCulloch et al. | 117/4 |
| 6,240,116 | B1 | 5/2001 | Lang et al. | 372/50 |
| 6,494,371 | B1 | 12/2002 | Rekow et al. | 235/454 |
| 6,530,687 | B1 | 3/2003 | Suzuki et al. | 374/131 |
| 6,531,681 | B1 | 3/2003 | Markle et al. | 219/121.69 |
| 6,747,245 | B2 | 6/2004 | Talwar et al. | 219/121.8 |
| 6,771,686 | B1 | 8/2004 | Ullman et al. | 372/92 |
| 6,780,692 | B2 | 8/2004 | Tatsuiki et al. | 438/166 |
| 6,809,012 | B2 | 10/2004 | Yamazaki et al. | 438/473 |
| 6,895,164 | B2 | 5/2005 | Saccomanno | 385/146 |
| 6,987,240 | B2 | 1/2006 | Jennings et al. | 219/121.8 |
| 7,005,601 | B2 | 2/2006 | Jennings | 219/121.66 |
| 7,129,440 | B2 | 10/2006 | Adams et al. | 219/121.65 |
| 7,135,392 | B1 | 11/2006 | Adams et al. | 438/166 |
| 2003/0196996 | A1 | 10/2003 | Jennings et al. | 219/121.73 |
| 2004/0095983 | A1 | 5/2004 | Whitley | 372/108 |
| 2004/0149217 | A1 | 8/2004 | Collins et al. | 118/723 |
| 2004/0179807 | A1 | 9/2004 | Tanaka | 385/146 |
| 2004/0188399 | A1 | 9/2004 | Smart | 219/121.69 |
| 2004/0198028 | A1 | 10/2004 | Tanaka et al. | 438/487 |
| 2004/0263986 | A1 | 12/2004 | Brown | 359/626 |
| 2005/0175285 | A1 | 8/2005 | Reynolds et al. | 385/39 |
| 2006/0008237 | A1 | 1/2006 | Imade | 385/146 |
| 2006/0102607 | A1 | 5/2006 | Adams et al. | 374/126 |
| 2006/0105585 | A1 | 5/2006 | Jennings et al. | 438/473 |
| 2007/0221640 | A1 * | 9/2007 | Jennings et al. | 219/121.76 |
| 2009/0084986 | A1 | 4/2009 | Adams et al. | 250/492.2 |

FOREIGN PATENT DOCUMENTS

| | | |
|---|---|---|
| EP | 0 231 794 A2 | 8/1987 |
| EP | 0458388 A1 | 11/1991 |
| JP | 57099747 A | 6/1982 |
| JP | 200191231 A | 3/2000 |
| WO | WO 03/089184 A1 | 10/2003 |
| WO | WO 2004/044955 | 5/2004 |

OTHER PUBLICATIONS

Official Action Dated Jul. 20, 2009 in Co-Pending U.S. Appl. No. 11/198,660.

* cited by examiner

METHOD OF FORMING PN JUNCTIONS INCLUDING A POST-ION IMPLANT DYNAMIC SURFACE ANNEAL PROCESS WITH MINIMUM INTERFACE TRAP DENSITY AT THE GATE INSULATOR-SILICON INTERFACE

CROSS-REFERENCE TO RELATED APPLICATIONS

This application claims the benefit of U.S. Provisional Application Ser. No. 60/856,622, filed Nov. 3, 2006.

BACKGROUND OF THE INVENTION

Ultra-shallow semiconductor junctions are formed by ion implantation of dopant impurities into a semiconductor crystalline material. Such junctions consist of a P-type doped region interfacing with an N-type doped region of the semiconductor material, so that such junctions may be referred to as PN junctions. The ion implantation process places most of the implanted dopant atoms into interstitial sites in the semiconductor crystal lattice and damage from the ion implant process transforms much of the semiconductor material from a crystalline to an amorphous state. At this point, therefore, the implanted dopant atoms are not chemically bonded with the silicon atoms of the wafer surface and therefore do not significantly affect the properties of the material, until the material is re-crystallized and the implanted atoms are somehow moved to substitutional sites in the crystal lattice. Returning the semiconductor material to its crystalline state and moving the implanted dopant atoms into substitutional sites in the crystal lattice requires a post ion implant annealing step. The best post-implant annealing process, particularly for devices with feature sizes smaller than 65 nm, is dynamic surface annealing. Dynamic surface annealing uses a single intense laser beam from an array of coherent CW lasers formed as a thin (10's or 100's of microns wide) long beam. This beam scanned in the direction of its narrow dimension across the wafer surface, typically in a raster pattern for example, until the entire wafer surface has been scanned. This process is preferred above all others because the wafer temperature is elevated to re-crystallization levels (e.g., near the melting temperature of the semiconductor material) over an extremely small zone that moves with the scanning of the beam. This zone is confined approximately to the width of the narrow line beam and to a below-surface depth in the wafer of only 10's of microns. The bulk of the wafer remains at a much cooler temperature so that each region is immediately cooled to its prior (ambient) temperature as soon as the laser beam moves beyond the region. Moreover, each point on the wafer surface is raised to the re-crystallization (near melting) temperature for an extremely short amount of time (e.g., a few milliseconds) before being immediately cooled back to its ambient temperature by conduction to the surrounding bulk of the wafer. As a result, diffusion or movement of the implanted dopant atoms is reduced to the smallest average distance heretofore attained, thus solving a fundamental problem in the fabrication of below-65 nanometer semiconductor devices.

One problem inherent in the dynamic surface anneal process is that the extremely narrow surface region illuminated by the intense line beam expands and bulges relative to the remainder of the surface, thereby creating significant stress in the underlying thin film structures. One problem this creates is that the stress in the interface between the gate insulator (the thin gate oxide) and the underlying semiconductor layer (the source-drain channel) increases defects in the bonds between the silicon dioxide material of the gate insulator and the underlying crystalline silicon material. These defects correspond to surface states in the gate oxide-silicon interface that interact with charge flowing in the source-drain channel and thereby detract from the device performance. Increasing the number of such defects, or density of surface states detracts from device performance. The surface state density is measured by well-known techniques involving an observation of the change in capacitance across the gate oxide-silicon interface with applied voltage. The problem with the dynamic surface anneal process is that the surface state density increases as the result of the stresses arising during annealing, and specifically from the stress of the expansion of the narrow illuminated portion of the wafer surface. There has seemed to be no way of avoiding this problem.

SUMMARY OF THE INVENTION

A method of forming transistors on a wafer includes forming gates over gate insulators on a surface of the wafer and ion implanting dopant impurity atoms into the wafer to form source and drain regions aligned on opposite sides of each gate. The wafer is then annealed by pre-heating the bulk of the wafer to an elevated temperature over 350 degrees C. but below a temperature at which the dopant atoms tend to cluster. Meanwhile, an intense line beam is produced having a narrow dimension along a fast axis from an array of coherent CW lasers of a selected wavelength. This line beam is scanned across the surface of the heated wafer along the direction of the fast axis, so as to heat, up to a peak surface temperature near a melting temperature of the wafer, a moving localized region on the surface of the wafer having (a) a width corresponding to the narrow beam width and (b) an extremely shallow below-surface depth. During the scanning step, the surface state density at the interface between the semiconductor material and the gate insulator is minimized by continuing to maintain the temperature of the bulk of the wafer outside of the moving localized region at said elevated temperature, while maintaining the rate at which the line beam is scanned along the fast axis at a rate in excess of 300 mm/sec.

DETAILED DESCRIPTION OF THE INVENTION

Figure 1:
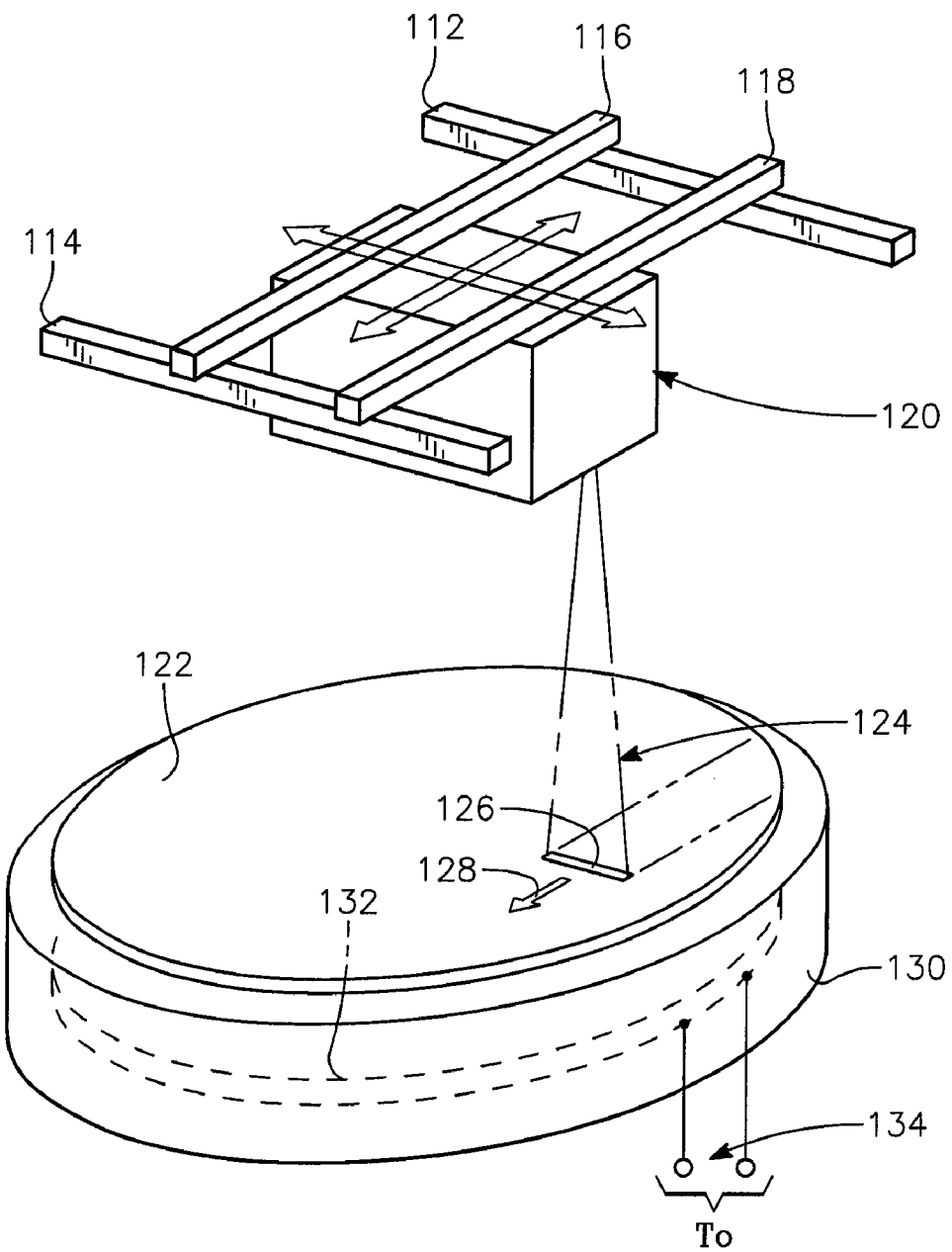
FIG. 1 is a simplified diagram of a dynamic surface annealing apparatus employed in carrying out an aspect of the invention.

Referring to FIG. 1, dynamic surface annealing is performed by optics 120 containing an array of coherent CW lasers whose output laser beams are combined into a single flat beam 124 projected onto the surface of a wafer 122 as a thin line beam 126. The line beam 126 is scanned along a fast axis 126 generally perpendicular to the line beam 126. The scanning may be performed in the manner of a raster scan with a gantry consisting of slow axis rails 112, 114 and fast axis rails 116, 118 that slide along the slow axis rails 112, 114, the optics 120 sliding along the fast axis rails. The wafer 122 is supported on a pedestal 130 having a buried heating element 132 powered by electrical terminals 134.

Figure 2:
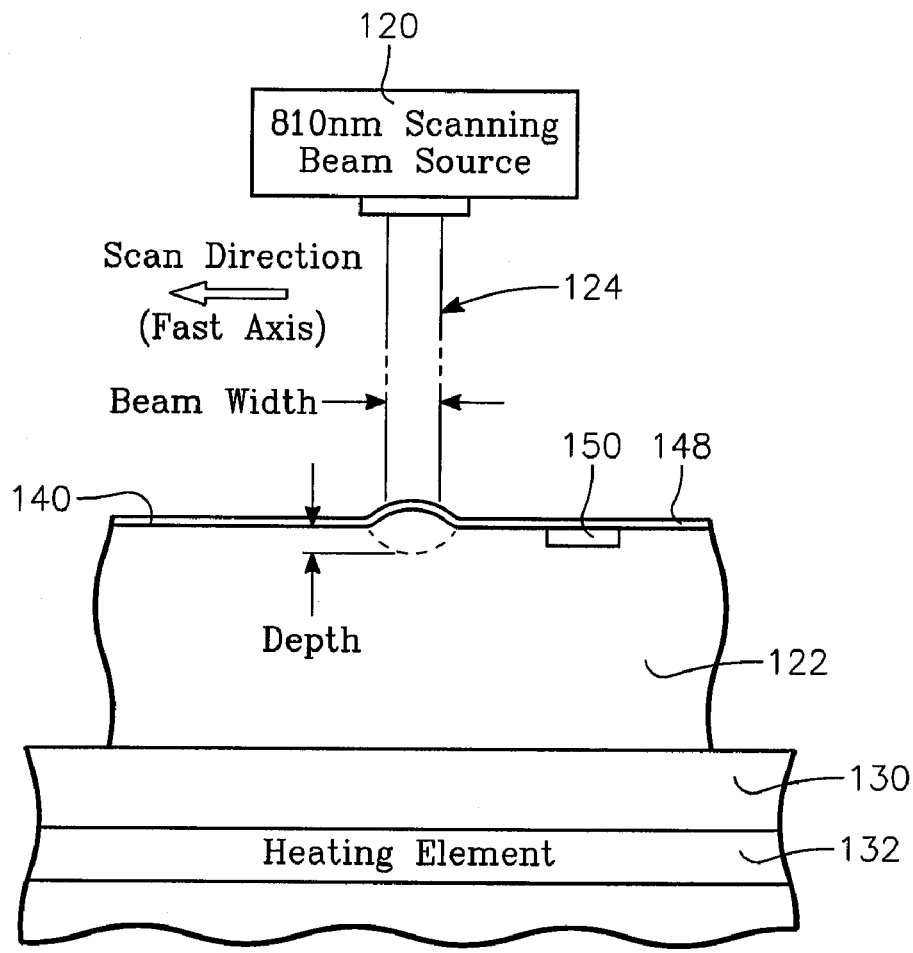
FIG. 2 is a cross-sectional view of a portion of a semiconductor wafer during dynamic surface annealing.
Figure 3:
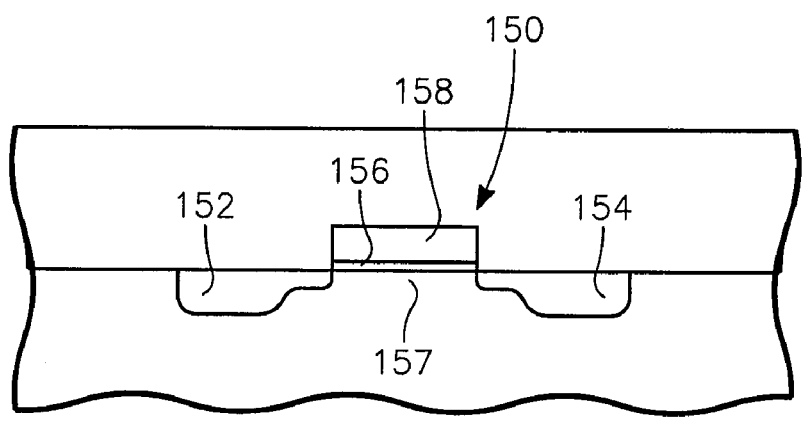
FIG. 3 is an enlarged view of a portion of the wafer of FIG. 2 containing a single field effect transistor, and depicting the gate oxide-silicon interface.

FIG. 2 is a cross-sectional view of the wafer 122 and pedestal 130 of FIG. 1. The surface 140 of the wafer 122 is covered with an optical absorber layer 148 of amorphous carbon that efficiently absorbs power of the laser beam 124 and conducts heat to the wafer surface. The narrow beam 124 raises the temperature of a narrow zone of the wafer surface to near the silicon melting temperature (e.g., 1350 degrees C.), creating a slight deformation or bulge in the wafer surface due to thermal expansion, as depicted in FIG. 2. The bulge depicted in the surface of the wafer 122 moves with the beam 124. A field effect transistor 150 is formed at the surface 140 of the wafer 122. FIG. 3 is an enlarged view of the field effect transistor 150. The transistor 150 includes source and drain regions 152, 154 formed by ion implantation in the semiconductor wafer surface, a thin gate insulator layer 156 of silicon dioxide overlying a semiconductor channel region 157 between the source and drain 152, 154, and a gate electrode 158 overlying the gate insulator 156. The bonds formed at the interface between the gate insulator 156 and the semiconductor channel 157 are disturbed by the stress of the thermal expansion induced by the scanning laser beam 124. This increases the number of defects or surface state density at this interface. For example, the density may increase from about $6.2 \times 10^{11}/cm^2$ (before anneal) to about $1.3 \times 10^{12}/cm^2$ Such an increase produces a significant deterioration in device performance. A related problem is that the increase in surface state density is greatly exacerbated with an increase in the peak dynamic surface anneal (DSA) annealing temperature at the wafer surface. This increase in surface state density is typically about 2.5% for every ten degrees Celsius in the peak DSA anneal temperature at the wafer surface.

To solve such problems, one approach might be to decrease the DSA peak temperature, for example by reducing the power of the laser beam. But this would compromise the level of dopant activation (which is directly related to transistor performance), quality and productivity of the dynamic surface anneal process.

Figure 4:
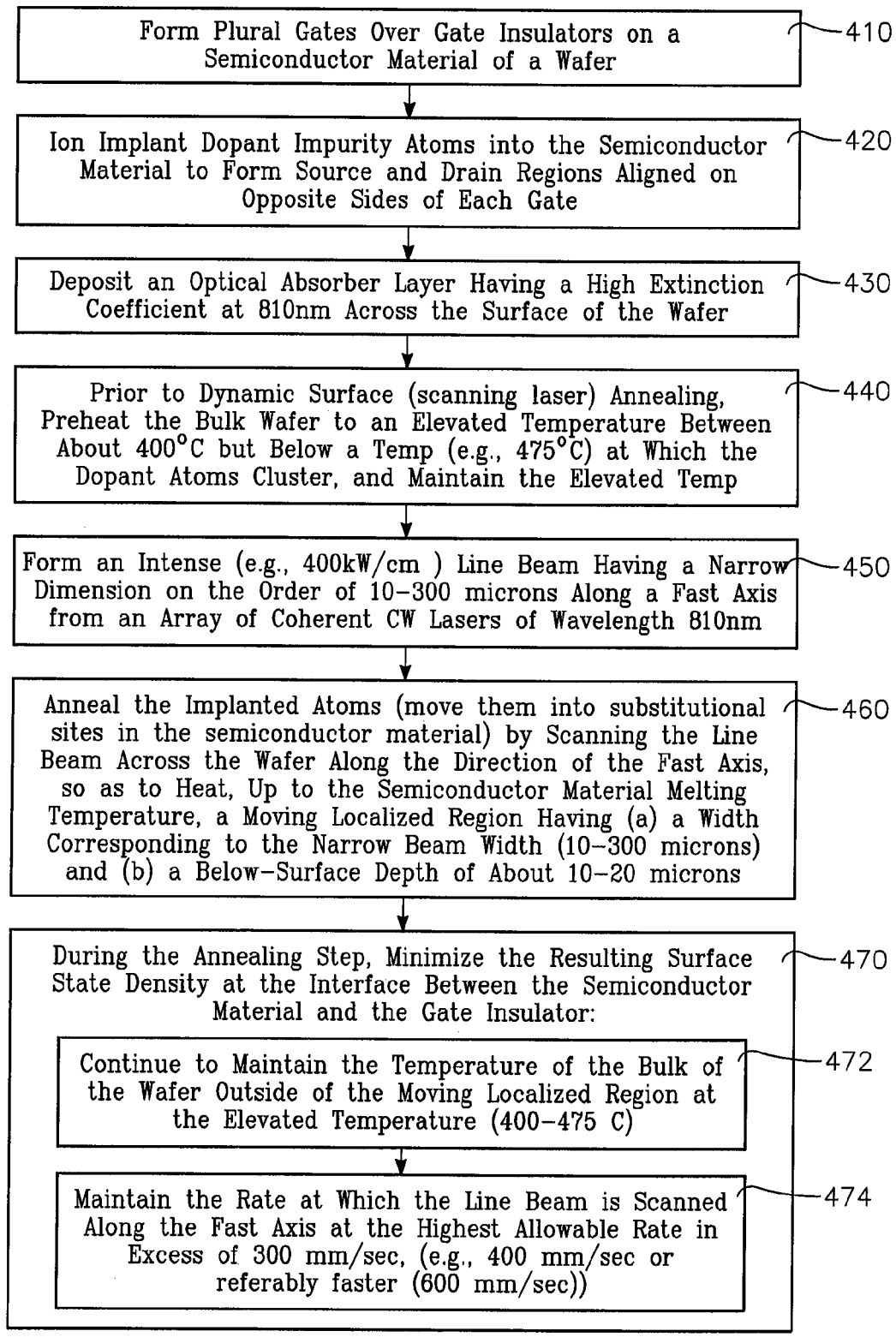
FIG. 4 is a block diagram depicting a process of the invention for fabricating a field effect transistor in accordance with the invention.

We have discovered a DSA process in which such a large increase in surface state density is avoided regardless of peak wafer surface temperature, and in which the sensitivity of surface state density to peak DSA anneal temperature is significantly reduced. Specifically, we have discovered that the combination of a higher laser beam scan rate along the fast axis with a higher bulk wafer temperature (as distinguished from the peak DSA annealing temperature at the wafer surface) has the combined effect of (1) reducing the increase in surface state density and (2) reducing the sensitivity of surface state density to peak annealing temperature. A process for forming PN junctions in a semiconductor material embodying this concept is depicted in FIG. 4. The first step is to form plural gates over gate insulators on a semiconductor material of a wafer (block 410 of FIG. 4). The next step (block 420 of FIG. 4) is to ion implant dopant impurity atoms into the semiconductor material to form source and drain regions aligned on opposite sides of each gate, to form the transistor structure depicted in FIG. 3. At this point, the implanted atoms are generally not in substitutional sites in the semiconductor material, and the semiconductor material surface has been transformed from a crystalline state to an amorphous state by ion bombardment damage. Formation of PN junctions requires the wafer to be annealed to re-crystallize the semiconductor material surface and to move dopant atoms into substitutional sites in the crystal lattice.

The anneal process begins by depositing across the surface of the wafer a thin film constituting an amorphous carbon layer that serves as an optical absorber layer having a high extinction coefficient at 810 nm (block 430 of FIG. 4). Prior to dynamic surface (scanning laser) annealing, the bulk (entire) wafer is pre-heated to an elevated temperature above 350 degrees C., preferably between about 400 degrees C. but below a temperature (i.e., 475 degrees C.) at which the dopant atoms tend to cluster (block 440 of FIG. 4). An intense (e.g., 400 kW/cm$^2$) line beam is generated from an array of coherent lasers (i.e., coherent with one another) of wavelength 810 nm (block 450 of FIG. 4). This beam has a narrow dimension on the order of 10-300 microns along a fast axis. The implanted atoms are excited to move them into substitutional sites in the semiconductor material while the material is re-crystallized by scanning the line beam across the wafer along the direction of the fast axis (block 460 of FIG. 4). This step heats, up to the semiconductor material melting temperature, a moving localized shallow region of the wafer surface having (a) a width corresponding to the narrow beam width (10-300 microns) and (b) a below-surface depth of about 10-20 microns). During this step, combined measures are taken to minimize the resulting surface state density at the interface between the semiconductor material and the gate insulator (block 470 of FIG. 4). These measures include:

(a) continuing to maintain the temperature of the bulk of the wafer (outside of the moving localized region) at the elevated temperature above 350 degrees C., preferably between about 400-475 degrees C. (block 472 of FIG. 4);

(b) maintaining the rate at which the line beam is scanned along the fast axis at the highest allowable rate in excess of 300 mm/sec, e.g., at 400 mm/sec or preferably at a faster rate such as 600 mm/sec (block 474 of FIG. 4).

Figure 5:
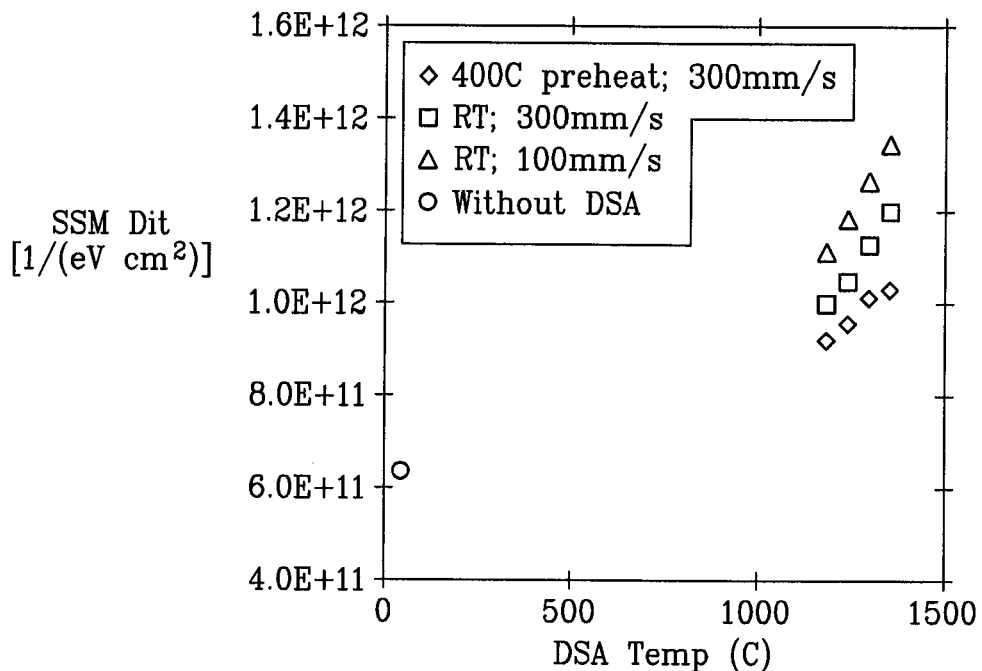
FIG. 5 is a comparative graph of ranges of surface state density at the gate oxide-silicon interface as a function of dynamic surface anneal peak temperature for different processes.

FIG. 5 is a graph depicting the improving (decreasing) trends in surface state density realized in the invention. Typically, the surface state density (vertical axis) increases with peak wafer surface temperature (horizontal axis) during the DSA annealing process. The single data range labeled with a circle represent multiple samples of surface density in the absence of dynamic surface annealing, in which the ion implanted wafer was annealed in a lower temperature rapid thermal anneal process of the prior art. The four data ranges labeled by the triangle symbols represent four groups of multiple samples of surface state density taken at four respective peak wafer surface temperatures of 1200, 1250, 1300 and 1350 degrees C. under the following annealing conditions: ambient (unheated) bulk wafer temperature and laser beam fast axis scan rate of 100 mm/sec. The four data ranges labeled by the square symbols represent four groups of multiple samples of surface state density taken at the same four peak wafer surface temperatures at the ambient (unheated) bulk wafer temperature and a faster (300 mm/sec) laser beam scan rate. The four data ranges labeled by the diamond symbols represent four groups of multiple samples of surface state density taken at the same four peak wafer surface temperatures at a heated bulk wafer temperature of 400 degrees C. and a faster (300 mm/sec) laser beam scan rate.

These data demonstrate that the minimum surface state density is obtained with higher bulk wafer temperature and faster scan rate.

Figure 6:
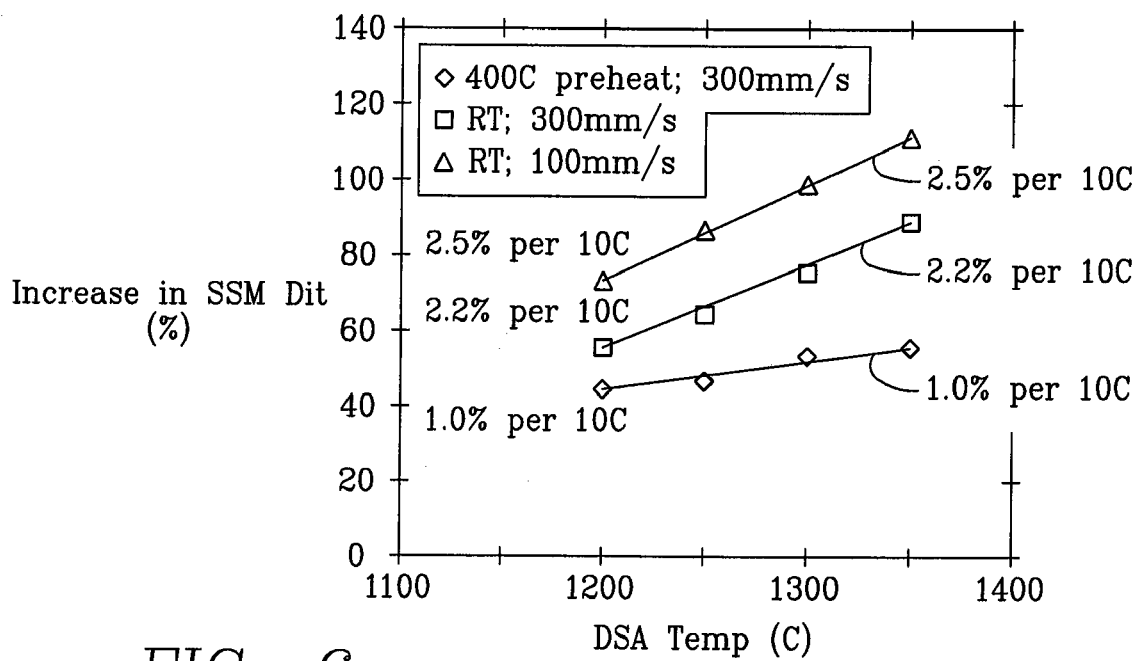
FIG. 6 is a comparative graph depicting the increase in surface state density in dynamic surface anneal processes relative to surface state density prior to dynamic surface anneal for different processes.

FIG. 6 is a graph corresponding to FIG. 5 in which the vertical axis represents the increase in the surface state density over the low temperature (non-DSA) process. FIG. shows that this increase grows with the peak DSA wafer surface temperature (horizontal axis). FIG. 6 also shows that this growth is minimized if the wafer is preheated and the laser beam scan rate is high. The growth rate for a DSA process with no pre-heating of the wafer and a slow beam scan rate is 2.5% for every 10 degrees C. of wafer surface temperature. For a high scan rate and a high bulk wafer temperature, this growth is reduced to only 1% for every 10 degrees C. of peak wafer surface temperature.

First working example: laser beam scan rate along the fast axis: 400 mm/sec, bulk wafer temperature: 400 degrees C.

Second working example: laser beam scan rate along the fast axis: 500 mm/sec, bulk wafer temperature: 425 degrees C.

Third working example: laser beam scan rate along the fast axis: 600 mm/sec, bulk wafer temperature: 450 degrees C.

While the invention has been described in detail by specific reference to preferred embodiments, it is understood that variations and modifications thereof may be made without departing from the true spirit and scope of the invention.

What is claimed is:

1. A method of forming transistors on a wafer, comprising:
   forming gates over gate insulators on a surface of the wafer;
   ion implanting dopant impurity atoms into the wafer to form source and drain regions aligned on opposite sides of each gate;
   heating the bulk of the wafer to an elevated temperature over 350 degrees C. and below 475 degrees C.;
   producing a line beam of a selected power density and having a narrow dimension along a fast axis from an array of coherent CW lasers of a selected wavelength;
   scanning the line beam across the wafer along the direction of the fast axis, so as to heat, up to a peak surface temperature near a melting temperature of the wafer, a moving localized region on the surface of the wafer having (a) a width corresponding to the narrow beam width and (b) a below-surface depth in a range of about 10 to 20 microns, said range being attainable at a nominal scanning rate along said fast axis of said line beam of 100 mm/sec at said selected power density; and
   during the scanning step, minimizing the surface state density at the interface between the semiconductor material and the gate insulator by:
      continuing to maintain the temperature of the bulk of the wafer outside of the moving localized region at said elevated temperature; and
      maintaining the scanning rate along said fast axis of said line beam in excess of 300 mm/sec.

2. The method of claim 1 wherein said peak surface temperature is sufficiently high to cause the implanted dopant atoms to move from interstitial sites to substitutional sites in a semiconductor crystal lattice of the wafer.

3. The method of claim 1 wherein the surface of said wafer comprises a crystalline semiconductor material which is at least partially transformed to an amorphous state by the ion implanting step, said peak surface temperature being sufficient to re-crystallize said semiconductor material.

4. The method of claim 1 wherein said peak surface temperature is on the order of between about 1150 degrees C. and 1350 degrees C.

5. The method of claim 1 wherein said peak surface temperature is on the order of 1300 degrees C.

6. The method of claim 1 wherein said elevated temperature of the bulk of said wafer is between about 400 degrees C. and 475 degrees C.

7. The method of claim 1 further comprising the step of depositing an optical absorber layer having a high extinction coefficient at said selected wavelength across the surface of the wafer.

8. The method of claim 7 said wherein said optical absorber layer comprises amorphous carbon.

9. The method of claim 1 wherein said beam width along said fast axis is on the order of 10-300 microns.

10. The method of claim 1 wherein the intensity of said beam is on the order of 400 kW/cm$_2$.

11. The method of claim 1 wherein said selected wavelength is about 810 nm.

12. The method of claim 1 wherein said scanning rate is about 400 mm/sec.

13. The method of claim 1 wherein said scanning rate is about 500 mm/sec.

14. The method of claim 1 wherein said scanning rate is about 600 mm/sec.

15. A method of forming transistors on a wafer, comprising:
    forming gates over gate insulators on a surface of the wafer;
    ion implanting dopant impurity atoms into the wafer to form source and drain regions aligned on opposite sides of each gate;
    heating the bulk of the wafer to an elevated temperature over 350 degrees C. and below 475 degrees C.;
    producing a line beam having a narrow dimension along a fast axis from an array of coherent CW lasers of a selected wavelength;
    scanning the line beam across the wafer along the direction of the fast axis, so as to heat, up to a peak surface temperature near a melting temperature of the wafer, a moving localized region on the surface of the wafer having (a) a width corresponding to the narrow beam width and (b) a below-surface depth on the order of tens of microns; and
    during the scanning:
       continuing to maintain the temperature of the bulk of the wafer outside of the moving localized region at said elevated temperature; and
       maintaining the scanning rate along said fast axis of said line beam in excess of 300 mm/sec.

16. The method of claim 15 wherein said elevated temperature of the bulk of said wafer is between about 400 degrees C. and 475 degrees C.

17. The method of claim 15 wherein said scanning rate is about 400 mm/sec.

18. The method of claim 15 wherein said scanning rate is about 500 mm/sec.

19. The method of claim 15 wherein said scanning rate is about 600 mm/sec.

* * * * *